United States Patent [19]

Ashman et al.

[11] Patent Number: 5,273,440
[45] Date of Patent: Dec. 28, 1993

[54] PAD ARRAY SOCKET

[75] Inventors: John J. Ashman, Huntingdon; Frank C. Youngfleish, Penna. Furnace, both of Pa.

[73] Assignee: Elco Corporation, Huntingdon, Pa.

[21] Appl. No.: 885,524

[22] Filed: May 19, 1992

[51] Int. Cl.⁵ .............................................. H01R 9/09
[52] U.S. Cl. .......................................... 439/71; 439/67
[58] Field of Search .................................. 439/68-73, 439/525, 526, 67, 77, 493

[56] References Cited

U.S. PATENT DOCUMENTS

| | | | |
|---|---|---|---|
| 4,554,505 | 11/1985 | Zachry | 439/71 |
| 4,658,331 | 4/1987 | Berg | 439/67 |
| 4,783,719 | 11/1988 | Jamison et al. | 439/68 |
| 5,059,129 | 10/1991 | Brodsky et al. | 439/70 |
| 5,158,467 | 10/1992 | Grabbe et al. | 439/71 |

*Primary Examiner*—Neil Abrams
*Attorney, Agent, or Firm*—Spensley Horn Jubas & Lubitz

[57] ABSTRACT

A pad array socket for use in mechanically and electrically connecting a high density pad array integrated circuit carrier to a printed circuit substrate. The socket comprises a flexible circuit, a molded elastomeric spring member, a frame, and a cover. The frame defines a cavity. The elastomeric spring member is placed at the bottom of the cavity. The flexible circuit is placed directly over the elastomeric spring member. An integrated circuit carrier is placed into the cavity upon the flexible circuit. The cover is then secured over the assembly, thereby applying downward pressure on the integrated circuit carrier. The spring member applies upward pressure to the flexible circuit, thereby causing the electrical contacts of the flexible circuit to come into contact with the electrical contacts of the integrated circuit carrier. The flexible circuit includes leads that extend from the socket and which may be soldered to the substrate, thereby mechanically securing the socket to the substrate and providing electrical contact between the socket and the substrate.

7 Claims, 4 Drawing Sheets

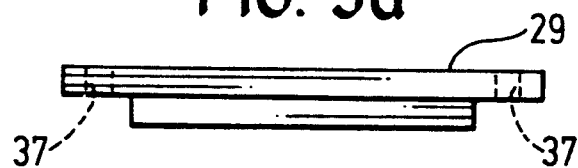
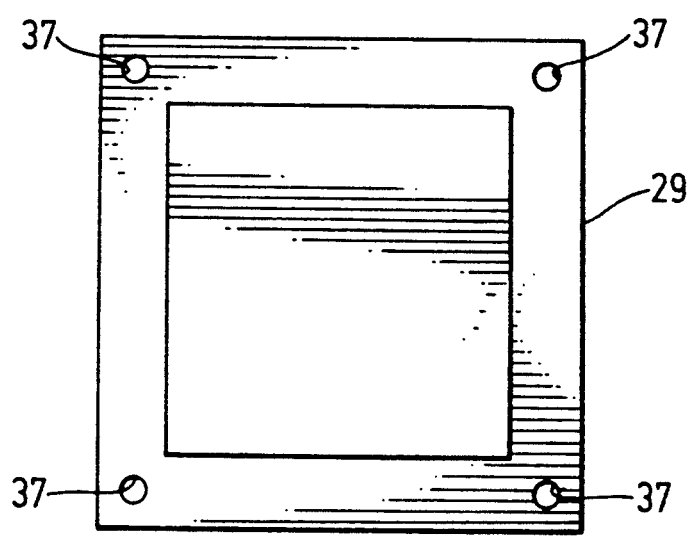
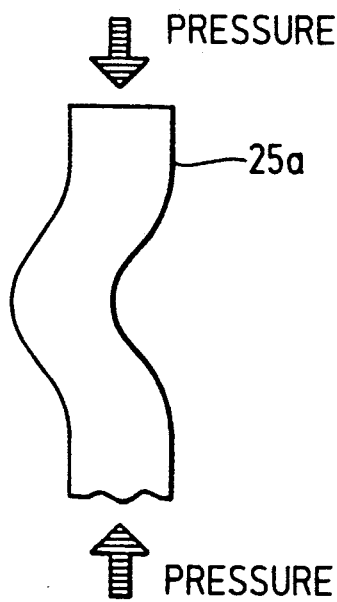

PAD ARRAY SOCKET

BACKGROUND OF THE INVENTION

1. Field of the Invention

This invention relates to an electrical socket for interfacing an integrated circuit to a printed circuit board, and more particularly to a surface mounted pad array socket for receiving an integrated circuit housed within a pad array integrated circuit chip carrier.

2. Description of Related Art

The prior art includes a number of sockets for electrically interconnecting integrated circuits (or "IC") to printed circuit (or "PC") boards. The principle objectives of such sockets are to electrically interconnect the electrical contacts of an IC to corresponding electrical contacts on the PC board and to mechanically fix the IC to the PC board.

In the past, integrated circuits had relatively few contact points. (A contact point is any point through which electrical current flows between an IC and a PC board.) However, as ICs have grown in sophistication and complexity, the number of contact points has increased. Consequently, the requirements of the sockets used to interconnect an IC to a PC board have changed.

A common means for interconnecting integrated circuits to PC boards is to install an IC in an integrated circuit carrier. An IC is electrically connected to the carriers conductive leads, which have relatively large dimensions, by fine wires. Typically, these wires are gold bonded to the IC. The leads provide electrical contact points external to the IC carrier. The relatively large dimensions of the leads make them relatively easy to solder to a PC board. Soldering the leads to a PC board serves the dual function of mechanically securing the IC carrier to the PC board and forming electrically conductive pathways between the PC board and the IC.

Manufacturers have developed a number of standard packages for ICs. One such package is known as a pad array IC carrier (carrier). The carrier has a large array of contact points on its bottom surface. The carrier may be placed over and soldered to an array of corresponding contact pads on a PC board that mirror the array of contact points on the carrier.

However, the greater the number of contact points on an IC carrier, the more difficult it is to solder the IC carrier to a PC board. Additionally, it is frequently desirable to be able to remove an IC from a PC board without having to unsolder the IC carrier. Since it is desirable to be able to remove and replace ICs previously installed, a variety of apparatus have been invented to interconnect an IC carrier to a PC board without directly soldering the carrier to the PC board. One such apparatus is described in U.S. Pat. No. 4,658,331 issued to Berg.

The Berg apparatus uses a flexible circuit upon which an IC is mounted. The IC is soldered to the flexible circuit. The flexible circuit and IC are fitted with a strain relief member to give form to the flexible circuit and to protect the solder joints between the flexible circuit and the chip from excessive stresses. The flexible circuit, IC, and strain relief member are then placed upon a PC board. Electrical contact pads of the flexible circuit make contact with corresponding electrical contact pads on the PC board. A backing frame is positioned on the opposite side of the PC board. The flexible circuit, strain relief member, and backing frame are secured to the PC board by screws. Compressive forces established by the screws cause the flexible circuit contact pads to maintain an electrical connection with the PC board contact pads without the use of solder.

In another apparatus, described in U.S. Pat. No. 5,018,005 issued to Lin et al., electrical connections are made between an IC and a flexible circuit element. The IC, along with the flexible circuit, are packaged to protect the IC. The flexible circuit element extends from the central region of the package and is soldered to a PC board for the purpose of transmitting electrical signals between the IC and the PC board.

A continuing goal of practitioners in the art of IC packaging and design is to create a means to easily mount an IC onto, and dismount the IC from, a PC board. Additionally, in many cases it is desirable for an IC package or socket to be mounted entirely on the surface of a single side of a PC board. Packages such as that described in the Lin patent are mounted entirely on one side of a PC board. However, the IC is difficult to replace in the field once mounted to a PC board. The IC cannot be removed from the package, and the package is soldered to the PC board. Therefore the package must be unsoldered to remove and replace the IC. The process of unsoldering a package from a PC board requires a certain degree of skill. Even when a person of relative skill performs the unsoldering, the PC board and/or IC package are at risk of being damaged. Furthermore, the process of unsoldering takes a relatively long time. Although sockets such as that described in the Berg patent do not require unsoldering to replace an IC, hardware must be mounted on both sides of a PC board.

Therefore, there is a need for an IC socket for use with an IC mounted in a pad array carrier from which the IC carrier can easily be removed without the need to unsolder the IC carrier or the integrated circuit socket from a PC board. The present invention provides such an IC socket.

SUMMARY OF THE INVENTION

The present invention is a socket used to mount an integrated circuit (IC) carrier to a printed circuit (PC) board. The socket includes a flexible circuit, a molded elastomeric spring member, a frame, and a cover. The frame defines a cavity. The elastomeric spring member is placed at the bottom of the cavity. The flexible circuit is placed directly over the elastomeric spring member. The flexible circuit is a flexible substrate upon which conductive material is placed to permit electrical current to be conducted to and from an IC carrier. The flexible circuit includes electrical leads that extend from the main body of the socket. An IC carrier is placed into the cavity upon the flexible circuit. The cover is then secured over the assembly, thereby applying downward pressure on the IC carrier. The spring member applies upward pressure to the flexible circuit, thereby forcing the electrical contacts of the flexible circuit into intimate contact with the electrical contacts of the IC carrier.

The leads of the socket are soldered to a printed circuit board, thereby allowing current to flow between the IC and the printed circuit board via the flexible circuit. The IC carrier can be easily removed from the socket by removing the cover, thereby freeing the IC carrier from the frame. The cover can be removed without accessing the opposite side of the printed circuit board.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

FIG. 3a is a side view of the cover of the preferred embodiment of the invention.

FIG. 3b is a top plane view of the cover of the preferred embodiment of the invention.

FIG. 4 is a side view of one of the columns of the spring member of the preferred embodiment of the invention, shown in a bowed condition.

Like reference numbers and designations in the various drawings refer to like elements.

DETAILED DESCRIPTION OF THE INVENTION

Throughout this description, the preferred embodiment and examples shown should be considered as examples, rather than as limitations on the present invention.

Figure 1:
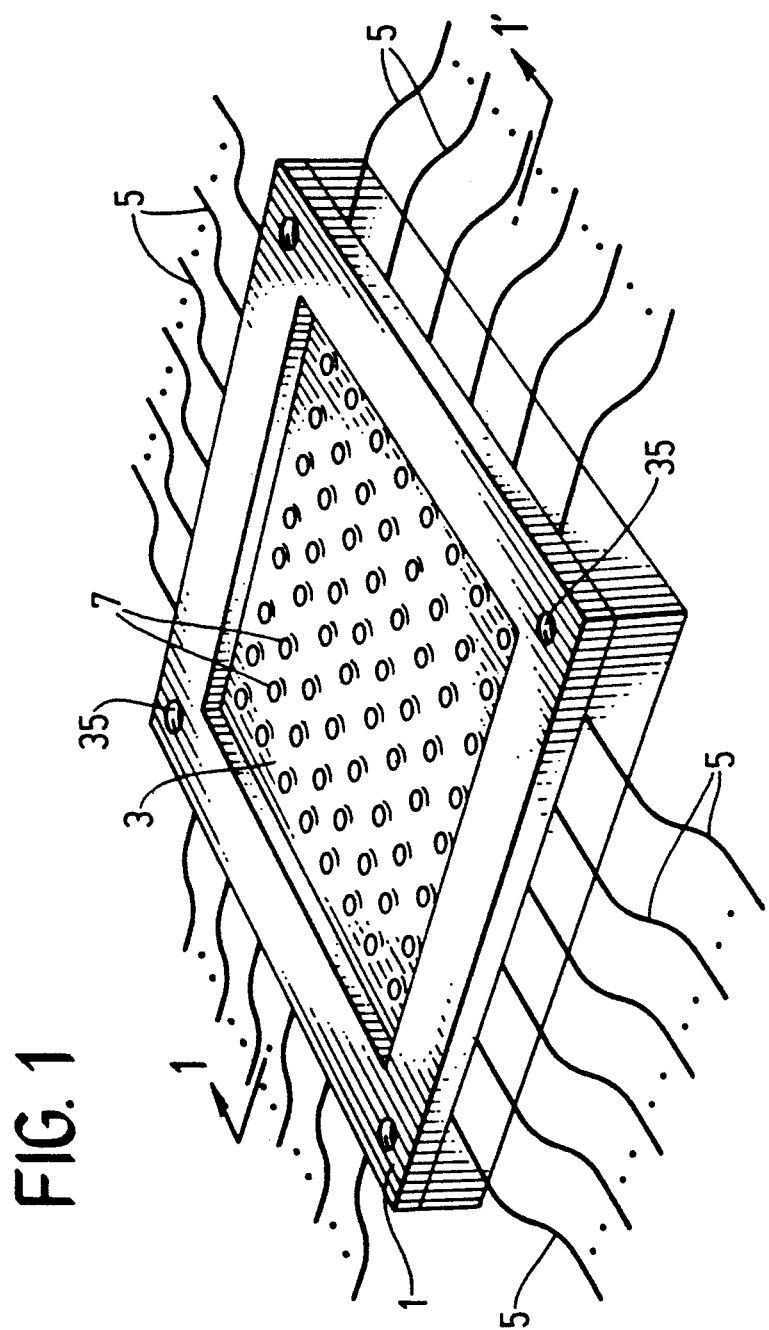
FIG. 1 is a top perspective view of the preferred embodiment of the invention with the cover removed.
Figure 2:
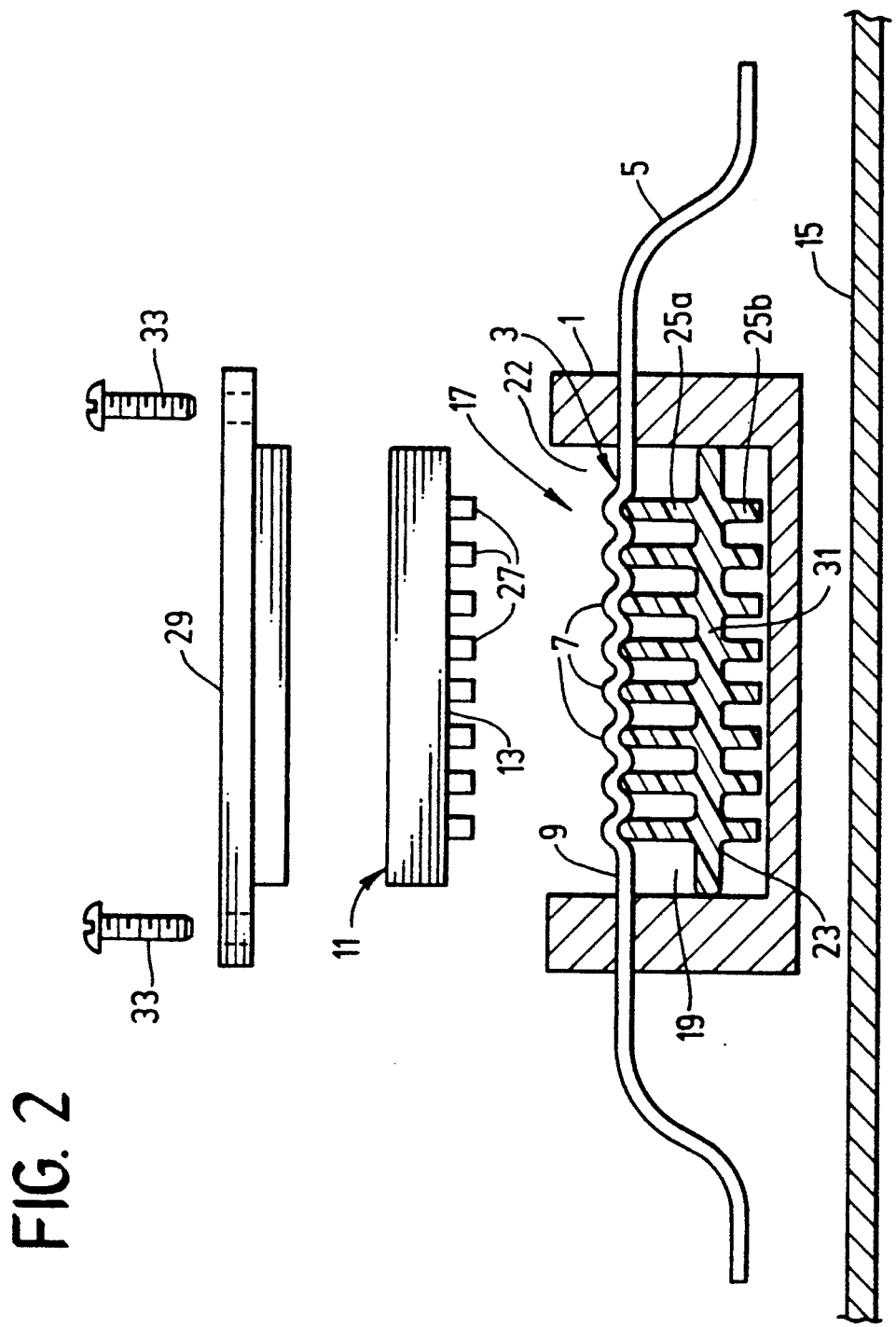
FIG. 2 is an exploded cross-sectional view of the preferred embodiment of the invention, taken along line 1—1' in FIG. 1.

Refer to FIGS. 1 and 2. The preferred embodiment of the inventive socket has a molded polymer frame 1, such as by molding the flexible circuit 3 into the frame 1. A flexible circuit 3 is assembled into the frame 1 and extends from the frame 1 to form surface mounted printed circuit solder tails 5. The frame 1 defines a cavity 17. The flexible circuit 3 divides the cavity 17 into a lower chamber 19 and an upper cavity 21. An elastomeric spring member 23 is placed into the lower chamber 19 before the flexible circuit 3 is assembled into place in the frame. The flexible circuit 3 rests upon the elastomeric spring member 23.

In the preferred embodiment, the spring 23 has a multiplicity of upper and lower columns 25a, 25b. Each of the columns in the preferred embodiment are of equal height and have circular cross-sectional areas of equal diameter. The columns protrude above and below a thin horizontal sheet or web of connecting material 31. However, in an alternative embodiment the spring member 23 has columns 25a, 25b that differ in height or width from one another. In another alternative embodiment, the spring member 23 has only upper columns 25a. In a further alternative embodiment, all or some of the columns 25a, 25b have other than circular cross-sectional shapes.

Each pair of upper and lower columns 25a, 25b correspond to a contact point 7 on the flexible circuit 3. The contact points 7 are cup-shaped bulges formed on the top of the flexible circuit 3 upon which there is conductive material. The contact points 7 form a two dimensional array across the flexible circuit 3. The top of each upper column 25a contacts a cup-shaped recess in the bottom of the contact point 7 that conforms to the shape of the bulge formed in the top of the flexible circuit 3 at each contact point 7. In an alternative embodiment, the contact points 7 are raised areas formed by depositing conductive material upon the flexible circuit substrate 9.

Each upper column 25a of the spring member 23 contacts the bottom of the bulge that forms the contact point 7 associated with that column 25a. Each lower column 25b extends down to the bottom of the lower chamber 19.

In the preferred embodiment, a conductor see FIG. 1 that runs along the surface of the substrate 9 of the flexible circuit 3 and down the solder tail 5 is associated with each contact point 7. The conductor provides a signal path from the contact point 7 to an external substrate, such as a printed circuit board 15. In the preferred embodiment, the conductors are stripline transmission lines. Use and fabrication of stripline circuits on flexible circuits is known to those skilled in the art. Use of stripline transmission lines to conduct the signals to and from an IC reduces signal loss and distortion due to impedance mismatches between the printed circuit board and the transmission lines used to couple the IC to the printed circuit board.

The upper cavity 21 accepts a ceramic or plastic pad array integrated circuit (IC) carrier 11. An IC (not shown) is enclosed in the IC carrier 11. Contact points 27 along the bottom surface 13 of the IC carrier 11 are electrically coupled to the corresponding conductive contact points (not shown) of the IC. Each contact point 27 of the IC carrier 11 corresponds to a contact point 7 on the flexible circuit 3.

A cover 29 is shown in FIGS. 2, 3a and 3b. The cover 29 is placed over the frame 1 and applies downward pressure upon the IC carrier 11, thereby forcing the contact points 27 of the IC carrier 11 into intimate contact with the contact points 7 of the flexible circuit 3. As further pressure is exerted upon the IC carrier 11, the columns 25a, 25b on which each contact point 7 of the flexible circuit 3 rests are compressed downward. The flexible circuit 3 and the IC carrier 11 are protected from excessive pressure by the fact that the columns 25a, 25b bow or "knuckle" outward at a predetermined break-point. FIG. 4 shows a column 25a, 25b that has reached the break-point and has bowed outward. Once a column 25 has bowed outward, the pressure exerted is reduced, thereby preventing damage to the IC carrier 11 or the flexible circuit 3. Varying the relative height, width, and composition of the upper and lower columns 25a, 25b will vary the amount of force which may be applied before each column will bow.

In the preferred embodiment of the invention, the cover 29 is held to the frame 1 by screws 33. Four threaded holes 35 drilled into the frame 1 accept the screws 33. The screws 33 pass through four throughholes 37 in the cover 29. However, any other means, such as clips, tabs, etc. would be acceptable alternatives for securing the cover 29 to the frame 1.

It should be apparent to one skilled in the art that the advantage of the present invention is that a standard pad array IC carrier can be easily placed into and removed from the inventive socket. Once placed into the socket, an IC carrier can be electrically and mechanically secured to the printed circuit board without being permanently affixed thereto. Additionally, the conductive paths that conduct signals between an IC carrier and a PC board have known controllable transmission characteristics, i.e., impedances can be matched to the conductive paths and components of the PC board and IC carrier. Further, the invention is mounted as a surface mounted device. Those skilled in the art will recognize that surface mounting is advantageous in many applications.

Figure 5:
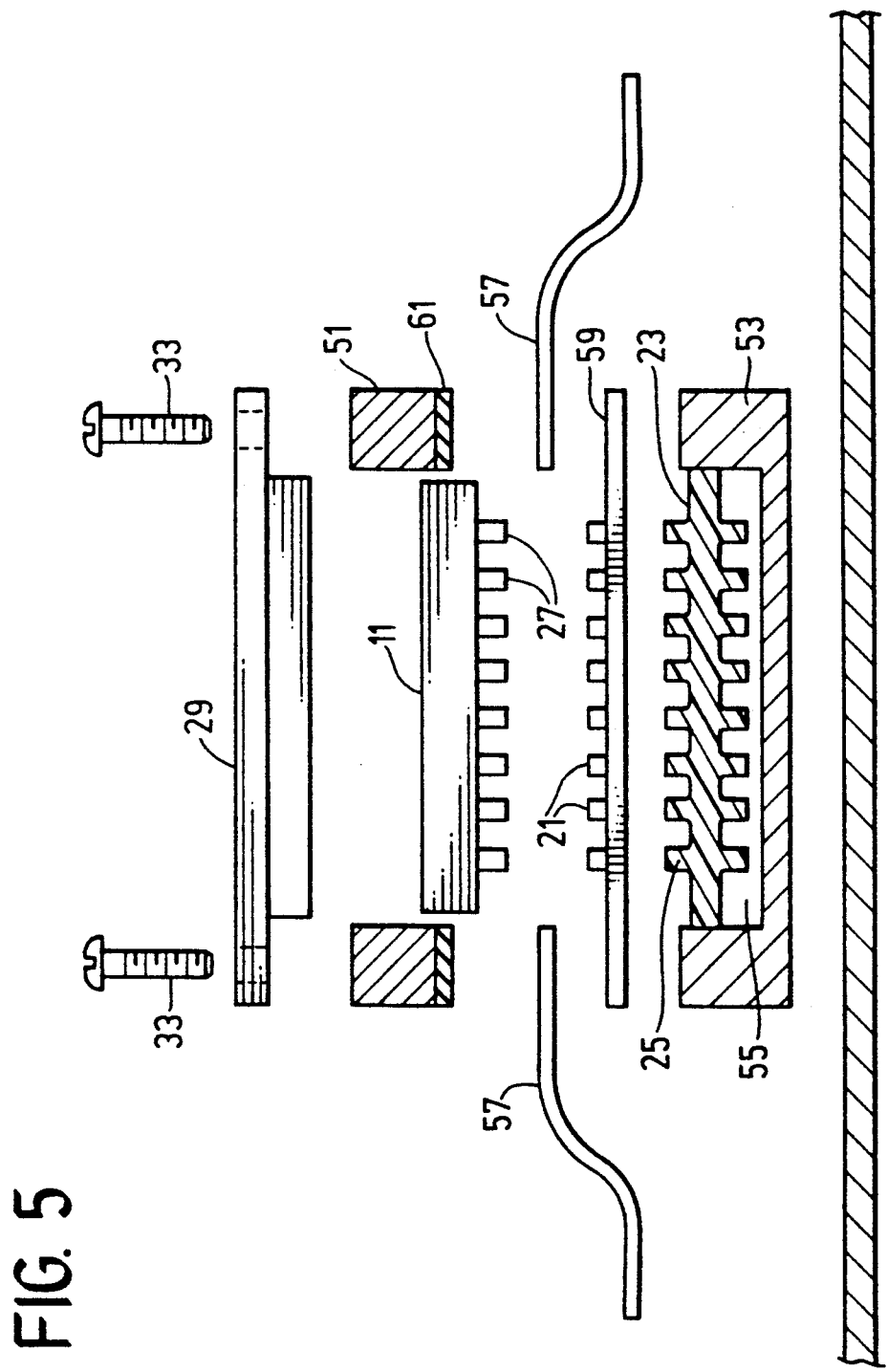
FIG. 5 is an exploded cross-sectional view of an alternative embodiment of the invention.

In an alternative embodiment of the present invention, shown in FIG. 5, the frame has two parts: an upper frame 51 and a lower frame 53. The upper frame 51 and the lower frame 53 are formed from either a metallic alloy (such as anodized aluminum) or a polymer. The upper frame 51 is generally rectangular with the center portion open, forming a structure resembling a picture frame.

The lower frame 53 is also generally rectangular. A cavity 55 is formed in one of the horizontal surface of the lower frame 53. An elastomeric spring member 23 having a plurality of columns 25 (as described in the preferred embodiment above) rests in the cavity 55. A flexible circuit 59 with stripline transmission lines fabricated upon it is placed over the spring member 23 and lower frame 53. The flexible circuit 59 has a plurality of contact points 21. Each contact point 21 corresponds to one of the columns 25 of the spring member 23 and to a contact point 27 on the IC carrier 11.

In the alternative embodiment, surface mounted printed circuit solder tails 57 are separate structures from the flexible circuit 59. The surface mounted solder tails 57 of the alternative embodiment are fabricated of a conductive material such as tin plated copper. When the lower frame 53 and upper frame 51 are assembled, the flexible circuit 59 and solder tails 57 will be secured between the lower frame 53 and the upper frame 51. If the upper frame 51 is constructed from conductive material, an layer of insulating material 61 must be placed between the upper frame 51 and the solder tails 57.

Once assembled, the upper frame 51 and the flexible circuit 59 define a cavity into which an IC carrier 11 may be placed. Each contact point 27 of the IC carrier 11 corresponds to a contact point 21 of the flexible circuit 59. A cover 29 is provided to apply a downward force upon the IC carrier to cause the respective contact points 27 and 21 to establish electrical contact with each other. In the alternative embodiment shown in FIG. 5, the cover 29 is fastened down by screws 33. Clips, adhesives, etc. may alternatively be used to fasten down the cover 29 in this embodiment.

The invention thus provides an integrated circuit socket for use with an integrated circuit mounted in a pad array carrier from which the integrated circuit carrier can easily be removed without the need to unsolder the integrated circuit carrier or the integrated circuit socket from a printed circuit board.

A number of embodiments of the present invention have been described. Nevertheless, it will be understood that various modifications may be made without departing from the spirit and scope of the invention. Accordingly, it is to be understood that the invention is not to be limited by the specific illustrated embodiment, but only by the scope of the appended claims.

We claim:

1. A pad array socket for electrically interconnecting a pad array integrated circuit carrier with a substrate, the socket being entirely mounted on only one side of the substrate, the socket comprising:
   (a) a frame defining a cavity sized to receive an integrated circuit carrier having an array of first contact pads;
   (b) a spring member situated within the frame cavity and having an array of flexible spring columns;
   (c) a flexible circuit situated within the frame cavity and in contact with the spring member, and having (1) a plurality of external conductors, the external conductors being configured to be electrically coupled to the substrate, and (2) an array of second contact pads on a first side of the flexible circuit, each second contact pad corresponding to a flexible spring column and to a first contact pad of the integrated circuit carrier, and being selectively coupled to at least one of the external conductors; and
   (d) a cover, configured to be secured to the frame, the cover exerting a compressive force upon an integrated circuit carrier received within the frame cavity when the cover is secured to the frame, thereby forcing together the first and second contact pads into electrical contact;
   wherein each flexible spring column bows outward before an opposing force, sufficient to cause damage to either the integrated circuit carrier or the flexible circuit, is exerted by the column upon the flexible circuit.

2. A pad array socket for electrically interconnecting a pad array integrated circuit carrier with a substrate, the socket being entirely mounted on only one side of the substrate, the socket comprising:
   (a) a frame defining a cavity sized to receive an integrated circuit carrier having an array of first contact pads;
   (b) a spring member situated within the frame cavity and having an array of flexible spring columns;
   (c) a flexible circuit molded within the frame cavity and in contact with the spring member, and having (1) a plurality of external conductors, the external conductors extending beyond the frame, the external conductors being configured as solder tails solderable to the substrate, and (2) an array of second contact pads on a first side of the flexible circuit, each second contact pad corresponding to a flexible spring column and to a first contact pad of the integrated circuit carrier, and being selectively coupled to at least one of the external conductors; and
   (d) a cover, configured to be secured to the frame, the cover exerting a compressive force upon an integrated circuit carrier received within the frame cavity when the cover is secured to the frame, thereby forcing together the first and second contact pads into electrical contact.

3. A pad array socket for electrically interconnecting a pad array integrated circuit carrier with a substrate, the socket being entirely mounted on only one side of the substrate, the socket comprising:
   (a) a frame defining a cavity sized to receive an integrated circuit carrier having an array of first contact pads;
   (b) a spring member situated within the frame cavity and having an array of flexible spring columns;
   (c) a flexible circuit situated within the frame cavity and in contact with the spring member, the flexible circuit having (1) a plurality of first contact pads, and (2) an array of second contact pads, each second contact pad corresponding to a flexible spring column and to a first contact pad of the integrated circuit carrier;
   (d) a plurality of solder tails, each solder tail being in electrical contact with the flexible circuit and configured to be electrically coupled to a surface of the substrate for electrically coupling the pad array socket to the surface of the substrate; and
   (d) a cover, configured to be secured to the frame, the cover exerting a compressive force upon an integrated circuit carrier received within the frame cavity when the cover is secured to the frame, thereby forcing together the first and second contact pads into electrical contact.

4. The pad array socket of claim 3 in which insulating material is placed between the upper frame and the solder tail means to prevent current from flowing between the solder tail means and the upper frame.

5. A pad array socket for electrically interconnecting a pad array integrated circuit carrier with a substrate, the socket being entirely mounted on only one side of the substrate, the socket comprising:

(a) a frame defining a cavity sized to receive an integrated circuit carrier having an array of first contact pads;

(b) a spring member situated within the frame cavity and having an array of upper flexible spring columns and an array of lower flexible spring columns;

(c) a flexible circuit situated within the frame cavity and in contact with the spring member, and having (1) a plurality of external conductors, the external conductors being configured to be electrically coupled to the substrate, and (2) an array of second contact pads on a first side of the flexible circuit, each second contact pad corresponding to a flexible spring column and to a first contact pad of the integrated circuit carrier, and being selectively coupled to at least one of the external conductors; and (d) a cover, configured to be secured to the frame, the cover exerting a compressive force upon an integrated circuit carrier received within the frame cavity when the cover is secured to the frame, thereby forcing together the first and second contact pads into electrical contact.

6. The pad array socket of claim 5, in which:

a. the flexible circuit has cup-shaped bulges on the first side under each contact pad;

b. the flexible circuit has cup-shaped recesses on a second side under each contact pad corresponding to each upper column structure;

c. the upper column structures have a top surface; and d. the top surface of each upper column structure contacts the corresponding recess in the flexible circuit.

7. The pad array socket of claim 5, in which the column structures of the upper array and the column structures of the lower array each have a break-point dependent upon height, width, and material composition of the column structure.

* * * * *